US006299684B1

United States Patent
Schulmann

(10) Patent No.: US 6,299,684 B1
(45) Date of Patent: Oct. 9, 2001

(54) GRIP ARRANGED ON A PULL SHAFT OF A CRYSTAL PULLING SYSTEM

(75) Inventor: Winfried Schulmann, Kleinostheim (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/652,875

(22) Filed: Aug. 31, 2000

(51) Int. Cl.⁷ ................................................ C30B 35/00
(52) U.S. Cl. ........................ 117/218; 117/217; 117/911
(58) Field of Search ............................... 117/208, 217, 117/218, 911

(56) References Cited

U.S. PATENT DOCUMENTS 5,126,113    6/1992   Yamagishi et al. ............... 117/217
6,042,644  * 3/2000   Kurosaka et al. ................... 117/13
6,053,975  * 4/2000   Iida et al. ........................ 117/218
6,126,746  * 10/2000  Scholler ........................... 117/218
6,139,633  * 10/2000  Nishiura .......................... 117/208

FOREIGN PATENT DOCUMENTS 297 09 172    9/1997   (DE) .
0781875       7/1997   (EP) .

* cited by examiner

Primary Examiner—Felisa Hiteshew
(74) Attorney, Agent, or Firm—Needle & Rosenberg, P.C.

(57) ABSTRACT

A grip for a crystal ingot mounted on a pull shaft has grip arms which cross each other. These grip arms have respective holding jaws on the side of the crystal ingot opposite the swivel bearing of the respective grip arm. Furthermore, a respective activating arm is provided on them on the side of the grip arm opposite the swivel bearing. As a result of this configuration, the grip is biased by the weight of a gripped crystal ingot in the closing direction.

36 Claims, 2 Drawing Sheets

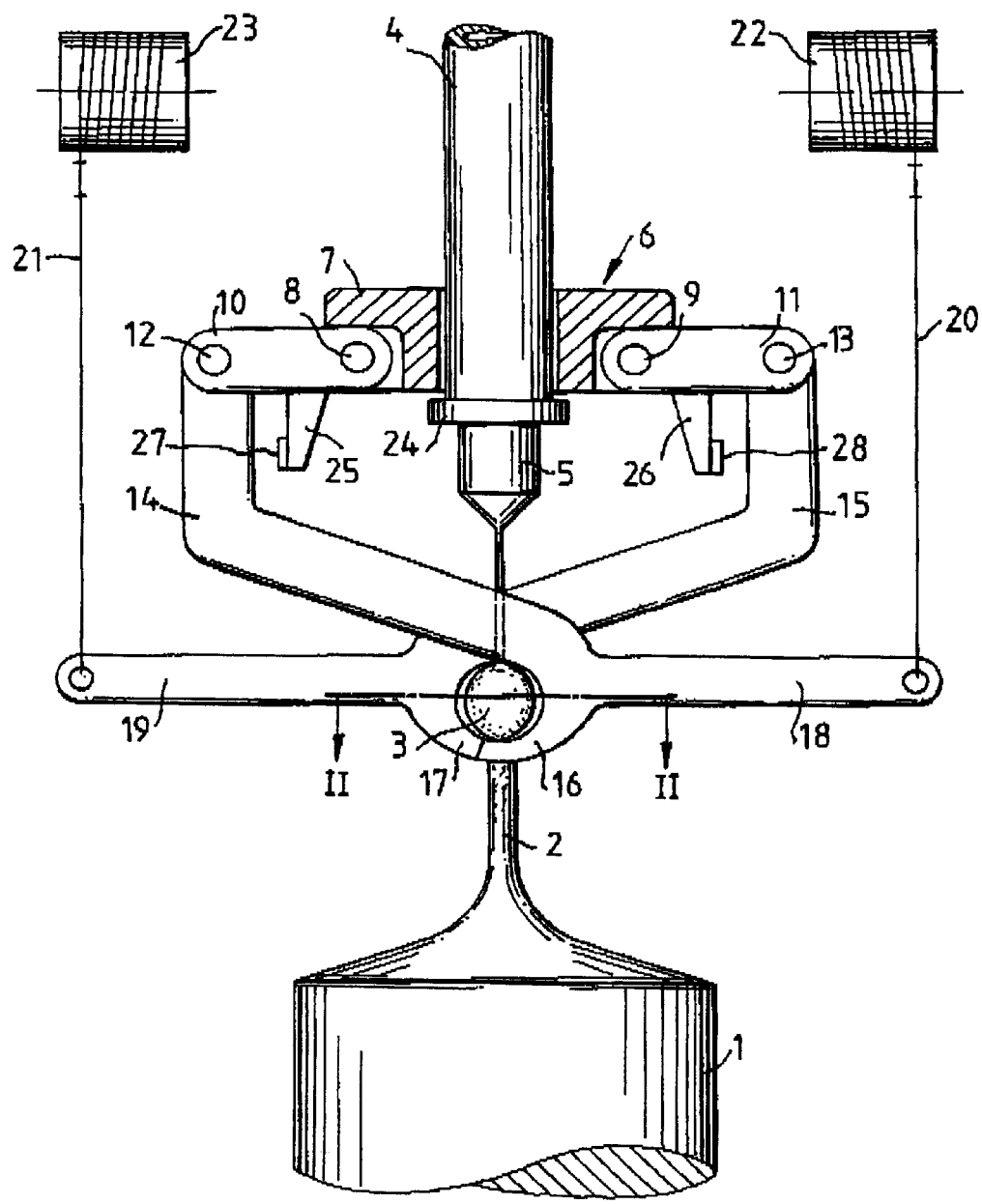
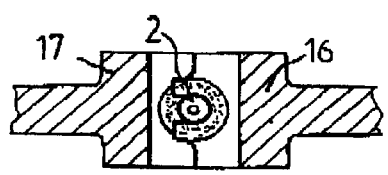

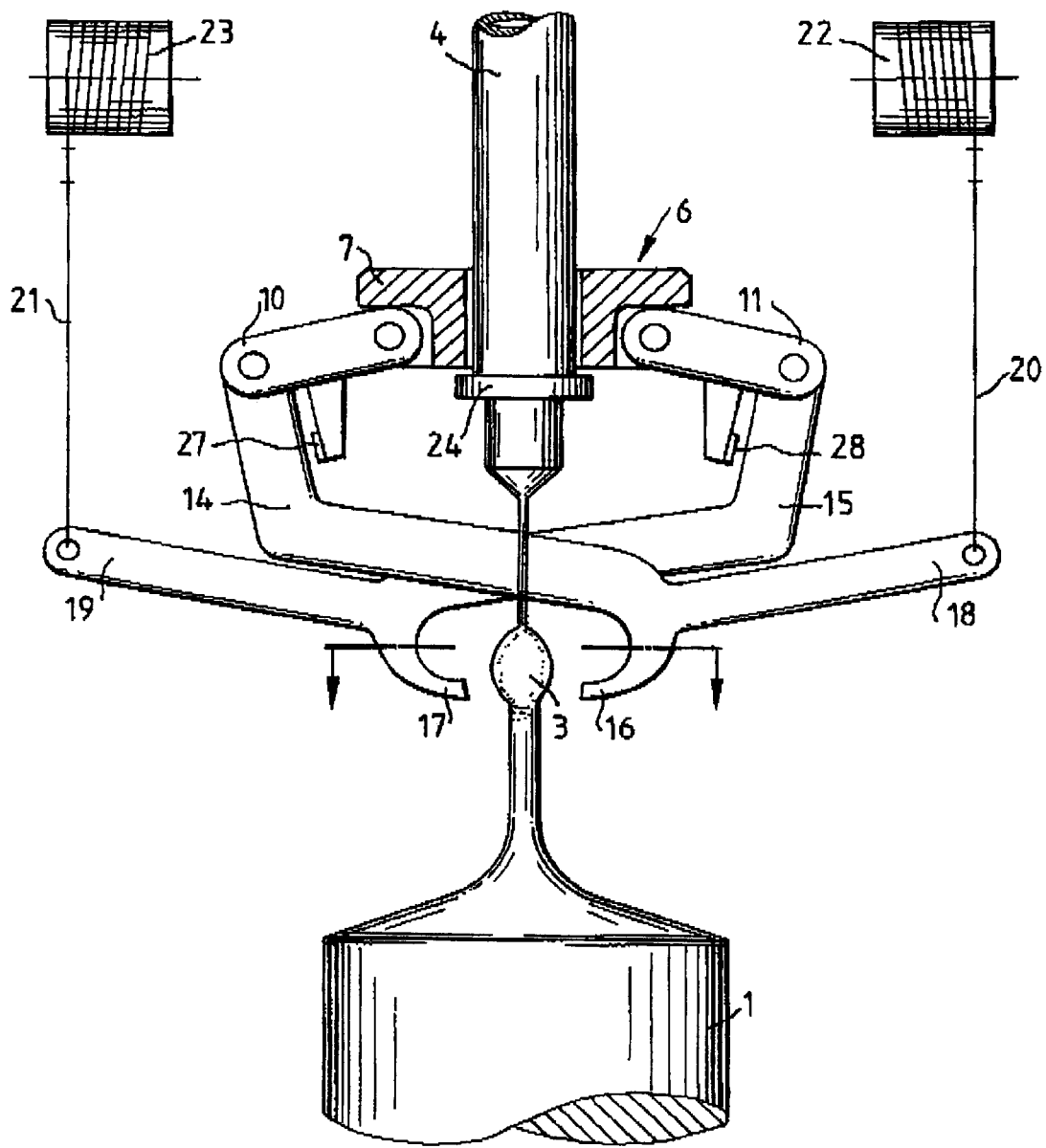
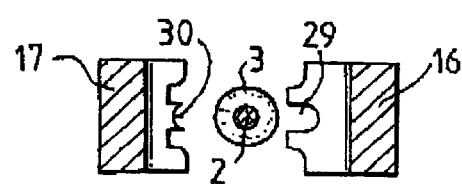

# US 6,299,684 B1

GRIP ARRANGED ON A PULL SHAFT OF A CRYSTAL PULLING SYSTEM

BACKGROUND OF THE INVENTION

1. Field of the Invention

The invention concerns a grip arranged movably on a pull shaft of a crystal pulling system whereby the grip has a slide ring which can be moved on the pull shaft and on which grip arms which can swivel beneath a thickening of a crystal ingot are borne so as to swivel around a swivel bearing, each of which grip arm has a holding jaw for grasping below the thickening of the crystal ingot and for which each grip arm has an outwardly directed activating arm, at the free end of which a cable of a cable drum arranged above the grip acts.

2. Description of the Related Art

A grip of the above type is the object of U.S. Pat. No. 5,126,113 to Yamagishi et al. In the grip explained in said publication, the respective holding jaws grip into a necking of the crystal ingot at approximately a vertical line below the swivel bearing of their grip arms. As a result of the weight of the crystal ingot, the holding jaws have a tendency to move radially outward and as a result to release the crystal ingot. In order to pull the crystal, the pull shaft and the grip are moved upward synchronously. If the grip were moved upward more sharply than was the pull shaft, the grip arms would have the tendency to move into open position.

To prevent an unintended opening of the grip aims, the grip arms according to said U.S. Pat. No. 5,126,113 to Yamagishi et al. in closed position are enclosed by an axially movable ring. During the closing movement of the grip arms, this ring slips from the upper position down onto the grip arms and then prevents the opening of the grip alms. Opening is not possible until the ring is pushed upward manually. The grip according to U.S. Pat. No. 5,126,113 to Yamagishi et al. therefore does not permit automatic opening and closing of its grip arms. In addition, there is a danger with it that the ring will tip on the grip arms as they are closed and therefore will not come into its lower position in which it blocks the grip arms in closed position.

The invention is based on the problem of configuring a grip of the type described above such that it can be moved only through the drive of the cable drums into open and closed position and cannot come into an open position on its own.

This problem is solved according to the invention in that the grip arms cross each other, that the holding jaw of each grip arm is arranged at the side of the crystal ingot lying across from the swivel bearing of the particular grip arm, and the activating arm is situated at the side of the grip arm across from the swivel bearing.

In such a grip, the weight of the crystal ingot gripped causes the grip to be acted upon by force in the closed position. A self-activated opening of the grip is automatically prevented by this means without an additional safety device. As a result of the crossing of the grip arms, one can select the effective lever arm for the closing force large enough so that the forces which must be applied via the cable cannot result in an unintentional opening of the grip. An opening of the grip is not possible until the crystal ingot is supported and therefore its weight no longer acts on the grip.

The grip is especially simply configured if a total of two grip arms situated opposite each other are provided.

The thickening of the crystal ingot is supported by the holding jaws from below on all sides if according to another further development of the invention the one holding jaw has a holding grove which is open on one side and is configured for grasping over a crystal neck of the crystal ingot and the other holding jaw has a holding ridge which engages in the holding groove in closed position and there can rest against the crystal neck.

The holding jaws of the grip do not have to move during opening and closing on a radius around the particular swivel bearing of the particular grip arm, but rather they can execute the radial lift to the outside or inside at an elevation if according to another, particularly advantageous further development of the invention the swivel bearings of the grip arms each are provided on shackles which are provided so as to swivel around an axis aligned parallel with the swivel axis of the swivel bearing and are aligned swivelably on the sliding ring radially to the outside.

As the grip is pulled up on the pull shaft by means of the cable, the swivel movement of the grip arm is limited if the shackles each have a stop which limits the swivel movement of the grip arm linked to it in open position.

The stop is particularly simply configured if it is provided on a downward-directed extension arm of the particular shackle. During the raising of the pull shaft, the cables always remain sufficiently tight so that no slack develops if the cable drums are configured as electrical springs.

The invention permits various embodiments. For further illumination of its basic principle, one such embodiment form is depicted in the drawings and will be described below.

BRIEF DESCRIPTION OF THE DRAWINGS

FIG. 1 shows a pull shaft with the grip according to the invention and a crystal ingot gripped by it.

FIG. 2 shows a horizontal section through a portion of the grip along line II—II in FIG. 1.

FIG. 3 shows depiction corresponding to FIG. 1 with the grip in open position.

FIG. 4 shows a section corresponding to FIG. 2 in open position of the grip.

DETAILED DESCRIPTION OF THE PREFERRED EMBODIMENTS

FIG. 1 shows a crystal ingot 1 with a crystal neck 2 which has a thickening 3 and has a connection with a pull shaft 4. Pull shaft 4 bears a seed crystal 5. The depicted device serves to pull a single crystal according to the Czochralski method.

Pull shaft 4 is encircled by a grip 6. The grip has a sliding ring (7) which can be moved on pull shaft 4 and which bears shackles 10, 11 directed to the outside each of which can be swiveled around a horizontal axis 8, 9. At its free end, each shackle 10, 11 has a swivel bearing 12, 13 aligned parallel with axis 8, 9 and each of which bears a grip arm 14, 15. These two grip arms 14, 15 cross each other and each have in the lower area a holding jaw 16, 17. It is important for the invention that as a result of the crossing of grip arms 14, 15, holding jaw 16 of grip arm 14, seen in the drawing on the left, is situated on the right side of crystal neck 2 and corresponding holding jaw 17 of right grip arm 15 is situated on the left side of crystal ingot 2. As a result of this configuration, the weight of crystal ingot 1 causes the grip 6 to be biased in the closing direction.

Left grip arm 14 has an activating arm 18 directed radially to the right, while right grip arm 15 is provided with an activating arm 19 directed radially to the left. The free end of each activating arm 18, 19 is connected to a cable 20, 21 which each can be wound up on a cable drum 22, 23 configured as an electrical spring or can be unwound from it.

Pull shaft 4 has in the lower area an encircling collar 24 on which sliding ring 7 sits from above in the depicted position. If pull shaft 4 moves upward, it carries grip 6 via collar 24 upward with it, whereby cable drums 22, 23 wind up the respective cables 20, 21 until there is no slack. The weight of crystal ingot 1 is therefore no longer transmitted over the area of crystal neck 2 having a very small diameter above thickening 3.

It can be further seen in FIG. 1 that shackles 10, 11 each have a downward-directed extension arm 25, 26 with a stop 27, 28. Stops 27, 28 rest against the respective bordering grip arms 14, 15 when grip 6 is pulled upward in open condition by means of cable 20, 21 on pull shaft 4.

FIG. 2 shows how holding jaws 16, 17 enclose crystal neck 2 in closed condition of grip 6.

In the position of grip 6 shown in FIG. 3, holding jaws 16, 17 are in open position so that they release thickening 3. Slide ring 7 still rests on collar 24 of pull shaft 4. If cables 20, 21 are wound further onto respective cable drums 22, 23, grip arms 14, 15 are raised while sliding ring 7, as a result of its weight and the articulated connection to grip arms 14, 15 via shackles 10, 11, initially remains in contact at collar 24. If, however, stops 27, 28 come against the respective grip arms 14, 15, the grip 6 will then be raised as a whole.

It can be seen in FIG. 4 that holding jaw 16 has a holding groove 29 which leads into it and which is configured for gripping under thickening 3 and in which closed grip 6 can engage a holding ridge 30 of opposite holding jaw 17.

What is claimed is:

1. A grip movably arranged on a pull shaft of a crystal pulling system which has a movable sliding ring on the pull shaft to which grip arms which can each be swiveled under a thickening of a crystal ingot are swivelably borne around a swivel bearing and which each have a holding jaw for gripping under the thickening of the crystal ingot and in which each grip arm has an outwardly directed activating arm, on the free end of which a cable of a cable drum arranged above the grip acts, characterized in that the grip arms cross each other, that the holding jaw of each grip arm is arranged on the side of the crystal ingot opposite the respective swivel bearing of the respective grip arm and that the activating arm is situated on the side of the grip arm opposite the swivel bearing.

2. Grip according to claim 1, characterized in that in total two grip arms which are situated opposite each other are provided.

3. Grip according to claims 2, characterized in that one holding jaw has an open holding groove configured so as to grasp around a crystal neck of the crystal ingot and the other holding jaw has a holding ridge which in the closed position engages in the holding groove, and there can be applied against the crystal neck.

4. Grip according to claim 3, characterized in that the swivel bearing of the grip arms each are provided on shackles which are provided radially toward the outside on the sliding ring so as to be capable of swiveling around an axis aligned parallel the swivel axis of the swivel bearing.

5. Grip according to claim 4, characterized in that the stop is provided on a downward-directed extension arm of the respective shackle.

6. Grip according to claim 5, characterized in that the cable drums are configured as electrical springs.

7. Grip according to claim 4, characterized in that the cable drums are configured as electrical springs.

8. Grip according to claim 3, characterized in that the shackles each have a stop which limits the swivel movement of the grip arm coupled to it in an open position.

9. Grip according to claim 8, characterized in that the stop is provided on a downward-directed extension arm of the respective shackle.

10. Grip according to claim 9, characterized in that the cable drums are configured as electrical springs.

11. Grip according to claim 8, characterized in that the cable drums are configured as electrical springs.

12. Grip according to claim 3, characterized in that the stop is provided on a downward-directed extension arm of the respective shackle.

13. Grip according to claim 12, characterized in that the cable drums are configured as electrical springs.

14. Grip according to claim 3, characterized in that the cable drums are configured as electrical springs.

15. Grip according to claim 2, characterized in that the swivel bearing of the grip arms each are provided on shackles which are provided radially toward the outside on the sliding ring so as to be capable of swiveling around an axis aligned parallel the swivel axis of the swivel bearing.

16. Grip according to claim 15, characterized in that the stop is provided on a downward-directed extension arm of the respective shackle.

17. Grip according to claim 16, characterized in that the cable drums are configured as electrical springs.

18. Grip according to claim 15, characterized in that the cable drums are configured as electrical springs.

19. Grip according to claim 2, characterized in that the stop is provided on a downward-directed extension arm of the respective shackle.

20. Grip according to claim 19, characterized in that the cable drums are configured as electrical springs.

21. Grip according to claim 2, characterized in that the cable drums are configured as electrical springs.

22. Grip according to claim 1, characterized in that one holding jaw has an open holding groove configured so as to grasp around a crystal neck of the crystal ingot and the other holding jaw has a holding ridge which in the closed position engages in the holding groove, and there can be applied against the crystal neck.

23. Grip according to claim 22, characterized in that the swivel bearing of the grip arms each are provided on shackles which are provided radially toward the outside on the sliding ring so as to be capable of swiveling around an axis aligned parallel the swivel axis of the swivel bearing.

24. Grip according to claim 23, characterized in that the stop is provided on a downward-directed extension arm of the respective shackle.

25. Grip according to claim 24, characterized in that the cable drums are configured as electrical springs.

26. Grip according to claim 23, characterized in that the cable drums are configured as electrical springs.

27. Grip according to claim 22, characterized in that the stop is provided on a downward-directed extension arm of the respective shackle.

28. Grip according to claim 27, characterized in that the cable drums are configured as electrical springs.

29. Grip according to claim 22, characterized in that the cable drums are configured as electrical springs.

30. Grip according to claim 1, characterized in that the swivel bearing of the grip arms each are provided on shackles which are provided radially toward the outside on the sliding ring so as to be capable of swiveling around an axis aligned parallel the swivel axis of the swivel bearing.

31. Grip according to claim 30, characterized in that the stop is provided on a downward-directed extension arm of the respective shackle.

32. Grip according to claim 31, characterized in that the cable drums are configured as electrical springs.

33. Grip according to claim 30, characterized in that the cable drums are configured as electrical springs.

34. Grip according to claim 1, characterized in that the stop is provided on a downward-directed extension arm of the respective shackle.

35. Grip according to claim 34, characterized in that the cable drums are configured as electrical springs.

36. Grip according to claim 1, characterized in that the cable drums are configured as electrical springs.

* * * * *